(12) United States Patent
Park et al.

(10) Patent No.: US 11,201,256 B2
(45) Date of Patent: Dec. 14, 2021

(54) INFRARED DETECTING DEVICE AND INFRARED DETECTING SYSTEM INCLUDING THE SAME

(71) Applicant: SAMSUNG ELECTRONICS CO., LTD., Suwon-si (KR)

(72) Inventors: Changyoung Park, Yongin-si (KR); Sanghun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/918,485

(22) Filed: Jul. 1, 2020

(65) Prior Publication Data

US 2021/0242362 A1    Aug. 5, 2021

(30) Foreign Application Priority Data

Feb. 3, 2020   (KR) .................... 10-2020-0012623

(51) Int. Cl.
| | | |
|---|---|---|
| *H01L 33/00* | (2010.01) | |
| *H01L 21/00* | (2006.01) | |
| *H01L 31/107* | (2006.01) | |
| *H01L 31/0352* | (2006.01) | |
| *H01L 31/105* | (2006.01) | |

(52) U.S. Cl.
CPC .. *H01L 31/1075* (2013.01); *H01L 31/035236* (2013.01); *H01L 31/1055* (2013.01)

(58) Field of Classification Search
CPC ............................................. H01L 31/035236
USPC ................................. 257/98; 438/29, 69–72
See application file for complete search history.

(56) References Cited

U.S. PATENT DOCUMENTS

| | | | |
|---|---|---|---|
| 5,442,221 A | | 8/1995 | Mosser et al. |
| 6,437,362 B2 * | | 8/2002 | Suzuki .................. B82Y 20/00 257/21 |
| 9,472,707 B2 * | | 10/2016 | Shirane ................ H01L 31/101 |
| 9,583,656 B2 * | | 2/2017 | Nozawa ........... H01L 31/03046 |
| 9,601,643 B2 * | | 3/2017 | Yoshikawa .......... H01L 31/055 |
| 9,680,040 B2 | | 6/2017 | Shibata et al. |
| 10,079,324 B2 * | | 9/2018 | Yamaguchi ....... H01L 31/03046 |
| 10,297,701 B2 * | | 5/2019 | Balasekaran ....... H01L 31/0304 |
| 2011/0037099 A1 | | 2/2011 | Takada et al. |
| 2013/0342683 A1 | | 12/2013 | Nelson et al. |
| 2015/0120092 A1 | | 4/2015 | Rennó |
| 2015/0273085 A1 | | 10/2015 | Bawendi et al. |
| 2015/0311380 A1 | | 10/2015 | Solari et al. |

(Continued)

FOREIGN PATENT DOCUMENTS

| | | |
|---|---|---|
| EP | 0 421 205 A2 | 4/1991 |
| EP | 2 787 525 A1 | 10/2014 |
| JP | 6-077582 A | 3/1994 |

(Continued)

OTHER PUBLICATIONS

Communication dated Nov. 27, 2020, issued by the European Patent Office in counterpart European Application No. 20183918.0.

*Primary Examiner* — Calvin Lee
(74) *Attorney, Agent, or Firm* — Sughrue Mion, PLLC

(57) ABSTRACT

Provided are an infrared detecting device and an infrared detecting system including the infrared detecting device. The infrared detecting device includes at least one infrared detector, and the at least one infrared detector includes a substrate, a buffer layer, and at least one light absorbing portion. The buffer layer includes a superlattice structure.

17 Claims, 12 Drawing Sheets

(56) References Cited

U.S. PATENT DOCUMENTS

2020/0357841 A1* 11/2020 Meylan ............... H01L 31/1892

FOREIGN PATENT DOCUMENTS

| JP | 2000058884 A | 2/2000 |
| JP | 2003017410 A | 1/2003 |
| JP | 2015015306 A | 1/2015 |
| JP | 2019-096820 A | 6/2019 |
| KR | 100349599 B1 | 8/2002 |

* cited by examiner

INFRARED DETECTING DEVICE AND INFRARED DETECTING SYSTEM INCLUDING THE SAME

CROSS-REFERENCE TO RELATED APPLICATION

This application claims priority to Korean Patent Application No. 10-2020-0012623, filed on Feb. 3, 2020, in the Korean Intellectual Property Office, the disclosure of which is herein incorporated by reference in its entirety.

BACKGROUND

1. Field

Example embodiments relate to infrared detecting devices and infrared detecting systems including the infrared detecting devices.

2. Description of Related Art

In general, while infrared images are formed in wavelength regions in which images cannot be perceived by a human eye, infrared cameras use infrared detecting devices and generate images which can be perceived by the human eye. Such infrared images are used in various fields such as a defense industry, medical equipment, surveillance, and security.

SUMMARY

One or more example embodiments provide infrared detecting devices and infrared detecting systems including the infrared detecting devices.

Additional aspects will be set forth in part in the description which follows and, in part, will be apparent from the description, or may be learned by practice of the presented embodiments of the disclosure.

According to an aspect of an example embodiment, provided is an infrared detecting device including:
at least one infrared detector,
wherein the at least one infrared detector includes:
a substrate;
a buffer layer provided on or above the substrate and having a superlattice structure; and
at least one light absorbing portion provided on or above the buffer layer.

The substrate may include GaAs.

The substrate may include silicon (Si), and the at least one infrared detector may further include a first semiconductor layer provided on or above the substrate, the first semiconductor layer including at least one of GaAs and AlAs.

The at least one infrared detector may further include a second semiconductor layer provided between the substrate and the first semiconductor layer. The second semiconductor layer may include at least one of germanium (Ge), GaP, and AlP.

The substrate may include germanium (Ge), and the at least one infrared detector may further include a semiconductor layer provided on or above the substrate, the semiconductor layer including at least one of GaAs and AlAs.

The buffer layer may include: a superlattice layer including at least one first material layer and at least one second material layer that are alternately grown on or above the substrate; and a buffer material layer grown on the superlattice layer.

The at least one first material layer may include GaAs, and the at least one second material layer may include AlAs.

The buffer material layer may include InP.

The at least one light absorbing portion may include at least one light absorbing layer and at least one quantum barrier layer that are alternately stacked on or above the buffer layer.

The at least one light absorbing layer may include at least one of a quantum well, a quantum dot, and a quantum wire.

Each of the at least one light absorbing layer and the at least one quantum barrier layer may include at least one of indium (In), gallium (Ga), aluminum (Al), arsenic (As), phosphorus (P), silicon (Si), zinc (Zn), and carbon (C).

The at least one infrared detector further may include: a first contact layer provided between the buffer layer and the at least one light absorbing portion; and a second contact layer provided on or above the at least one light absorbing portion.

The at least one light absorbing portion may include a plurality of light absorbing portions that are stacked on or above the buffer layer and configured to absorb light in different wavelength ranges.

The at least one infrared detector may include a plurality of infrared detectors arranged in a one-dimensional array or two-dimensional array.

According to an aspect of an example embodiment, provided is an infrared detecting system including: a light source; and an infrared detecting device configured to detect infrared light reflected from an object onto which light is emitted from the light source, wherein the infrared detecting device includes at least one infrared detector, wherein the at least one infrared detector includes: a substrate; a buffer layer provided on or above the substrate and having a superlattice structure; and at least one light absorbing portion provided on or above the buffer layer.

The buffer layer may include: a superlattice layer including at least one first material layer and at least one second material layer that are alternately grown on or above the substrate; and a buffer material layer grown on the superlattice layer.

The at least one light absorbing portion may include at least one light absorbing layer and at least one quantum barrier layer that are alternately stacked on or above the buffer layer.

The at least one light absorbing portion may include a plurality of light absorbing portions that are stacked on or above the buffer layer and configured to absorb light in different wavelength ranges.

The at least one infrared detector may include a plurality of infrared detectors arranged in a one-dimensional array or two-dimensional array.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
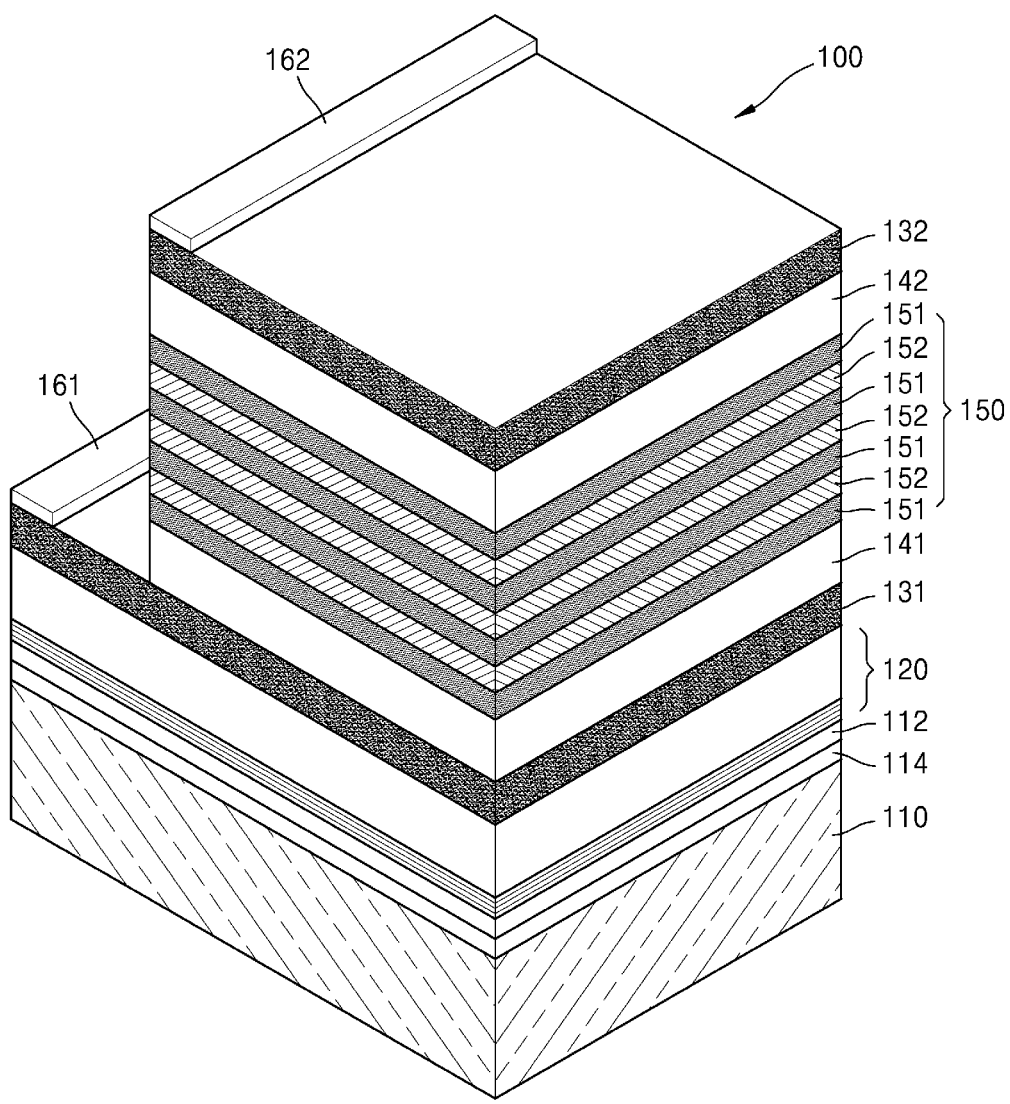
FIG. 1 is a perspective view illustrating an infrared detecting device according to an example embodiment.

Reference will now be made in detail to example embodiments with reference to the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b, and c," should be understood as including only a, only b, only c, both a and b, both a and c, both b and c, or all of a, b, and c.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above," "over," "on," "connected to" or "coupled to" another element, it may be directly over, above, on, connected, or coupled to the other element while making contact with the other element or may be above (e.g., an intervening element may be present) or without making contact with the other element. In contrast, when an element is referred to as being "directly above," "directly over," "directly on," "directly connected to" or "directly coupled to" another element or layer, there are no intervening elements or layers present.

The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or exemplary terms are used herein only to describe the disclosure and should not be considered for purposes of limitation unless defined by the claims.

Figure 2:
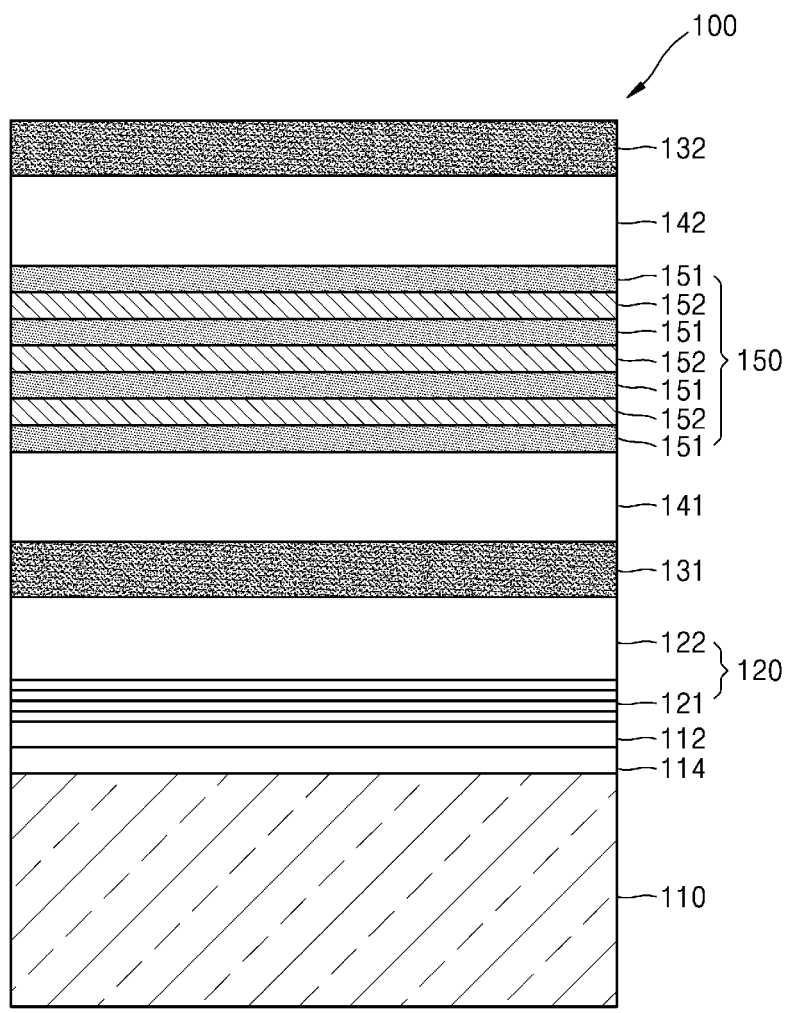
FIG. 2 is a cross-sectional view illustrating the infrared detecting device shown in FIG. 1.

FIG. 1 is a perspective view illustrating an infrared detecting device 100 according to an example embodiment. FIG. 2 is a cross-sectional view illustrating the infrared detecting device 100 shown in FIG. 1.

Referring to FIGS. 1 and 2, the infrared detecting device 100 includes an infrared detector that absorbs and detects light in an infrared wavelength band. For example, the infrared detecting device 100 may detect light in a wavelength range of about 1200 nm to about 2500 nm. However, the infrared detecting device 100 is not limited thereto, and the infrared detecting device 100 may also detect light in other wavelength bands.

The infrared detecting device 100 includes a substrate 110, a buffer layer 120, and a light absorbing portion 150. Here, for example, a silicon (Si) substrate may be used as the substrate 110. However, this is merely an example, and examples of the substrate 110 include semiconductor substrates including various other materials.

The substrate 110 may be provided with a first semiconductor layer 112, and a second semiconductor layer 114 may be provided between the substrate 110 and the first semiconductor layer 112. Here, each of the first and the second semiconductor layers 112 and 114 may include various semiconductor materials according to materials included in the light absorbing portion 150.

When the light absorbing portion 150 includes, for example, InGaAs, the second semiconductor layer 114 provided on an upper surface of the substrate 110 may include, for example, at least one of germanium (Ge), GaP, and AlP. The second semiconductor layer 114 may be formed by depositing, for example, at least one of germanium (Ge), GaP, and AlP on the upper surface of the substrate 110 by, for example, metal organic chemical vapor deposition (MOCVD).

The first semiconductor layer 112 provided on an upper surface of the second semiconductor layer 114 may include, for example, at least one of GaAs and AlAs. The first semiconductor layer 112 may be formed by depositing, for example, at least one of GaAs and AlAs on the upper surface of the second semiconductor layer 114 by, for example, MOCVD. In addition, the above-mentioned materials of the first and the second semiconductor layers 112 and 114 are merely examples, and other semiconductor materials may be used.

Figure 3:
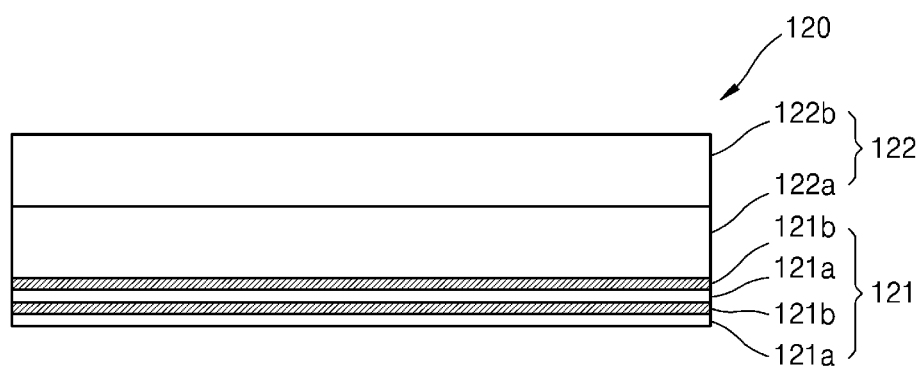
FIG. 3 is an enlarged view illustrating a buffer layer shown in FIG. 2.

A buffer layer 120 having a superlattice structure is provided on the first semiconductor layer 112. FIG. 3 is an enlarged view illustrating the buffer layer 120 shown in FIG. 2. The buffer layer 120 may include a superlattice layer 121 and a buffer material layer 122. Here, the superlattice layer 121 is provided on an upper surface of the first semiconductor layer 112, and the buffer material layer 122 is provided on an upper surface of the superlattice layer 121.

The superlattice layer 121 may have a superlattice structure in which two or more types of material layers are alternately grown, and each of the material layers of the superlattice layer 121 may have a thickness of about several nanometers (nm) or less.

In an example embodiment, the superlattice layer 121 may include at least one first material layer 121a and at least one second material layer 121b that are alternately grown on the upper surface of the first semiconductor layer 112. Here, the first material layer 121a may include, for example, GaAs, and the second material layer 121b may include, for example, AlAs. Each of the first and the second material layers 121a and 121b may be grown to a thickness of about 10 nm or less, but is not limited thereto. The superlattice layer 121 may be formed by alternately growing a GaAs layer and an AlAs layer each to a thickness of about 10 nm or less on the upper surface of the first semiconductor layer 112 by, for example, MOCVD. The number of GaAs layers and the number of AlAs layers grown as described above may each be about 1 to 300, but are not limited thereto.

In an example embodiment, the superlattice layer 121 is provided between the first semiconductor layer 112 and the buffer material layer 122 such that dislocations or defects, which may occur between the first semiconductor layer 112 and the buffer material layer 122 due to a lattice constant difference between the first semiconductor layer 112 and the buffer material layer 122, may be reduced.

For example, when the buffer material layer 122 is directly grown on a surface of the first semiconductor layer 112 in a situation in which the lattice constant difference between the material (for example, GaAs) of the first semiconductor layer 112 and the material (for example, InP) of the buffer material layer 122 is great, dislocations or defects may occur at an interface between the first semiconductor layer 112 and the buffer material layer 122 due to the lattice constant difference.

In an example embodiment, the superlattice layer 121 is provided between the first semiconductor layer 112 and the buffer material layer 122 such that an occurrence of dislocations, defects, or the like may suppressed between the first semiconductor layer 112 and the buffer material layer 122, and as a result, lattice matching may be possible.

For example, when the superlattice layer 121, in which a GaAs layer and an AlAs layer are alternately grown, is provided between the first semiconductor layer 112 including GaAs and the buffer material layer 122 including InP, dislocations or defects, which may occur between the first semiconductor layer 112 and the buffer material layer 122 due to the lattice constant difference between GaAs and InP, may be reduced.

The buffer material layer 122 is provided on an upper surface of the superlattice layer 121. The buffer material layer 122 may include, for example, InP. However, the buffer material layer 122 is not limited thereto. The buffer material layer 122 may be formed by growing, for example, InP on the upper surface of the superlattice layer 121 by, for example, MOCVD. The buffer material layer 122 may be grown to, for example, a thickness of about 0.05 µm to about 11 µm, but is not limited thereto.

For high surface quality of the buffer material layer 122, the buffer material layer 122 may include a low-temperature buffer material layer 122a grown on the upper surface of the superlattice layer 121, and a high-temperature buffer material layer 122b grown on an upper surface of the low-temperature buffer material layer 122a. Here, the low-temperature buffer material layer 122a may be provided to further suppress the occurrence of dislocations or defects, and may be grown at a lower temperature than the high-temperature buffer material layer 122b grown thereon.

For example, when the buffer material layer 122 includes a low-temperature InP layer (e.g., low-temperature buffer material layer 122a) and a high-temperature InP layer (e.g., high-temperature buffer material layer 122b), the low-temperature InP layer may be grown on the upper surface of the superlattice layer 121, for example, at about 600° C., and the high-temperature InP layer may be grown on an upper surface of the low-temperature InP layer, for example, at about 680° C. Here, the growth temperatures of the low-temperature InP layer and the high-temperature InP layer are merely examples, and may be varied.

Referring back to FIG. 2, a first contact layer 131, a first clad layer 141, the light absorbing portion 150, a second clad layer 142, and a second contact layer 132 may be sequentially stacked on the buffer layer 120. Here, each of the first contact layer 131, the first clad layer 141, the light absorbing portion 150, the second clad layer 142, and the second contact layer 132 may be formed by, for example, MOCVD. A detection structure, which is of a p-i-n junction type, may be formed on the buffer layer 120, and in this case, an i-region may be formed by the light absorbing portion 150.

The first contact layer 131 may be provided on an upper surface of the buffer layer 120. For example, the first contact layer 131 may include a material having a dopant of at least one of indium (In), gallium (Ga), aluminum (Al), arsenic (As), phosphorus (P), silicon (Si), zinc (Zn), and carbon (C). For example, the first contact layer 131 may include $In_xGaAs$ ($0.1 \leq x \leq 0.3$), $In_xGaAl_yAs$ ($0.05 \leq x \leq 0.85$, $0.01 \leq y \leq 0.75$), $In_xGaAsP_z$ ($0.05 \leq x \leq 0.85$, $0.05 \leq z \leq 0.75$), or a material having InP and a dopant.

The first contact layer 131 may be, for example, an n-type contact layer. In this case, the first contact layer 131 may include, for example, an n-type dopant such as silicon (Si), carbon (C), germanium (Ge), selenium (Se), or tellurium (Te). Alternatively, the first contact layer 131 may be a p-type contact layer. In this case, the first contact layer 131 may include, for example, a p-type dopant such as zinc (Zn) or magnesium (Mg).

An upper surface of the first contact layer 131 may be partially exposed, and a first electrode 161 may be provided on the exposed upper surface of the first contact layer 131. The first electrode 161 may include a metallic material having high conductivity. When the first contact layer 131 is an n-type contact layer, the first electrode 161 may be an n-type electrode. When the first contact layer 131 is a p-type contact layer, the first electrode 161 may be a p-type electrode.

The first clad layer 141 may be provided on the upper surface of the first contact layer 131. The first clad layer 141 and the second clad layer 142 may have a function of confining light absorbed by the light absorbing portion 150. The first and the second clad layers 141 and 142 may have an additional function of diffusing current.

For example, the first clad layer 141 may include a material having at least one dopant of indium (In), gallium (Ga), aluminum (Al), arsenic (As), phosphorus (P), silicon (Si), zinc (Zn), and carbon (C). For example, the first clad layer 141 may include $In_xGaAs$ ($0.1 \leq x \leq 0.3$), $In_xGaAl_yAs$ ($0.05 \leq x \leq 0.85$, $0.01 \leq y \leq 0.75$), $In_xGaAsP_z$ ($0.05 \leq x \leq 0.85$, $0.05 \leq z \leq 0.75$), or a material having InP and a dopant. Here, the dopant content of the first clad layer 141 may be less than the dopant content of the first contact layer 131.

When the first contact layer 131 is an n-type contact layer, the first clad layer 141 may be an n-type clad layer. In this case, the first clad layer 141 may include, for example, an n-type dopant such as silicon (Si), carbon (C), germanium (Ge), selenium (Se), or tellurium (Te). When the first contact layer 131 is a p-type contact layer, the first clad layer 141 may be a p-type clad layer. In this case, the first clad layer 141 may include, for example, a p-type dopant such as zinc (Zn) or magnesium (Mg).

The light absorbing portion 150 may be provided on an upper surface of the first clad layer 141. The light absorbing portion 150 may absorb light in an infrared wavelength band. For example, the light absorbing portion 150 may absorb light in a short wavelength infrared (SWIR) region. However, the light absorbing portion 150 is not limited thereto, and may absorb light in another wavelength band. For example, the light absorbing portion 150 may absorb light in a wavelength range of about 1200 nm to about 2500 nm.

The light absorbing portion 150 may include at least one light absorbing layer 152 and at least one quantum barrier layer 151 that are alternately stacked. Here, the at least one light absorbing layer 152 may include a quantum well.

For example, each of the at least one light absorbing layer 152 may be formed to have a thickness of about 1 nm to about 25 nm, and for example, each of the at least one quantum barrier layer 151 may be formed to have a thickness of about 2 nm to about 50 nm. However, these are merely examples, and the at least one light absorbing layer 152 and the at least one quantum barrier layer 151 may have various thicknesses.

The at least one light absorbing layer 152 and the at least one quantum barrier layer 151 of the light absorbing portion 150 may include at least one of indium (In), gallium (Ga), aluminum (Al), arsenic (As), phosphorus (P), silicon (Si), zinc (Zn), and carbon (C). For example, the at least one light absorbing layer 152 and the at least one quantum barrier layer 151 may include GaAs, $In_xGaAs$ ($0.05 \leq x \leq 0.85$), $In_xGaAl_yAs$ ($0.05 \leq x \leq 0.85$, $0.01 \leq y \leq 0.75$), $In_xGaAsP_z$ ($0.05 \leq x \leq 0.85$, $0.05 \leq z \leq 0.75$), or InP. However, these are merely examples.

The absorption wavelength band of the infrared detecting device 100 may be adjusted by changing at least one of the shape, material, and thickness of the at least one light absorbing layer 152, and the absorption intensity of the infrared detecting device 100 may be adjusted by changing the number of the at least one light absorbing layer 152.

In the above description, an example embodiment in which the at least one light absorbing layer 152 includes a quantum well has been described. However, this is a non-limiting example, and a light absorbing layer including at least one of a quantum well, a quantum dot (QD), and a quantum wire may be employed in the infrared detecting device 100 shown in FIG. 1.

Figure 4:
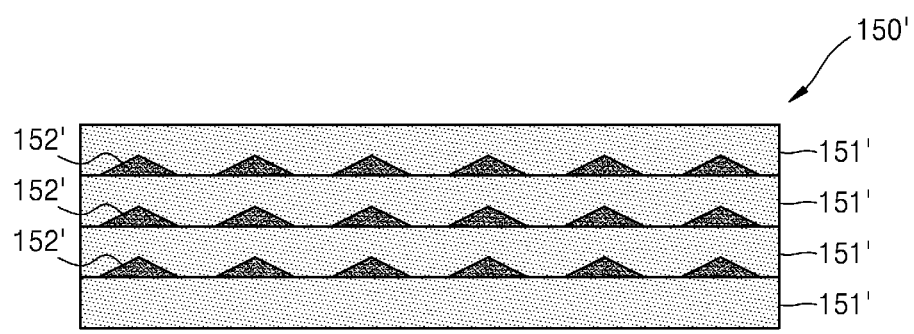
FIG. 4 is a view illustrating an example of a light absorbing portion that may be employed in the infrared detecting device shown in FIG. 1.

For example, FIG. 4 illustrates a light absorbing portion 150' that may be employed in the infrared detecting device 100 shown in FIG. 1. Referring to FIG. 4, light absorbing layers 152' provided between quantum barrier layers 151' include quantum dots. In addition, although not shown in FIG. 4, the light absorbing layers 152' may include quantum wires.

Referring back to FIG. 2, the second clad layer 142 may be provided on an upper surface of the light absorbing portion 150. As described above, the first and the second clad layers 141 and 142 may have a function of confining light absorbed by the light absorbing portion 150 and may also have a function of diffusing current.

For example, the second clad layer 142 may include a material having at least one dopant of indium (In), gallium (Ga), aluminum (Al), arsenic (As), phosphorus (P), silicon (Si), zinc (Zn), and carbon (C). For example, the second clad layer 142 may include $In_xGaAs$ ($0.1 \leq x \leq 0.3$), $In_xGaAl_yAs$ ($0.05 \leq x \leq 0.85$, $0.01 \leq y \leq 0.75$), $In_xGaAsP_z$ ($0.05 \leq x \leq 0.85$, $0.05 \leq z \leq 0.75$), or a material having InP and a dopant. Here, the dopant content of the second clad layer 142 may be less than the dopant content of the second contact layer 132.

When the first clad layer 141 is an n-type clad layer, the second clad layer 142 may be a p-type clad layer. In this case, the second clad layer 142 may include, for example, a p-type dopant such as zinc (Zn) or magnesium (Mg). When the first clad layer 141 is a p-type clad layer, the second clad layer 142 may be an n-type clad layer. In this case, the second clad layer 142 may include, for example, an n-type dopant such as silicon (Si), carbon (C), germanium (Ge), selenium (Se), and tellurium (Te).

The second contact layer 132 may be provided on an upper surface of the second clad layer 142. For example, the second contact layer 132 may include a material having at least one dopant of indium (In), gallium (Ga), aluminum (Al), arsenic (As), phosphorus (P), silicon (Si), zinc (Zn), and carbon (C). For example, the second contact layer 132 may include $In_xGaAs$ ($0.1 \leq x \leq 0.3$), $In_xGaAl_yAs$ ($0.05 \leq x \leq 0.85$, $0.01 \leq y \leq 0.75$), $In_xGaAsP_z$ ($0.05 \leq x \leq 0.85$, $0.05 \leq z \leq 0.75$), or a material having InP and a dopant.

When the first contact layer 131 is an n-type contact layer, the second contact layer 132 may be a p-type contact layer. In this case, the second contact layer 132 may include, for example, a p-type dopant such as zinc (Zn) or magnesium (Mg). When the first contact layer 131 is a p-type contact layer, the second contact layer 132 may be an n-type contact layer. In this case, the second contact layer 132 may include, for example, an n-type dopant such as silicon (Si), carbon (C), germanium (Ge), selenium (Se), and tellurium (Te).

A second electrode 162 may be provided on an upper surface of the second contact layer 132. The second electrode 162 may include a metallic material having high conductivity. When the second contact layer 132 is a p-type contact layer, the second electrode 162 may be a p-type electrode. When the second contact layer 132 is an n-type contact layer, the second electrode 162 may be an n-type electrode.

Figure 5:
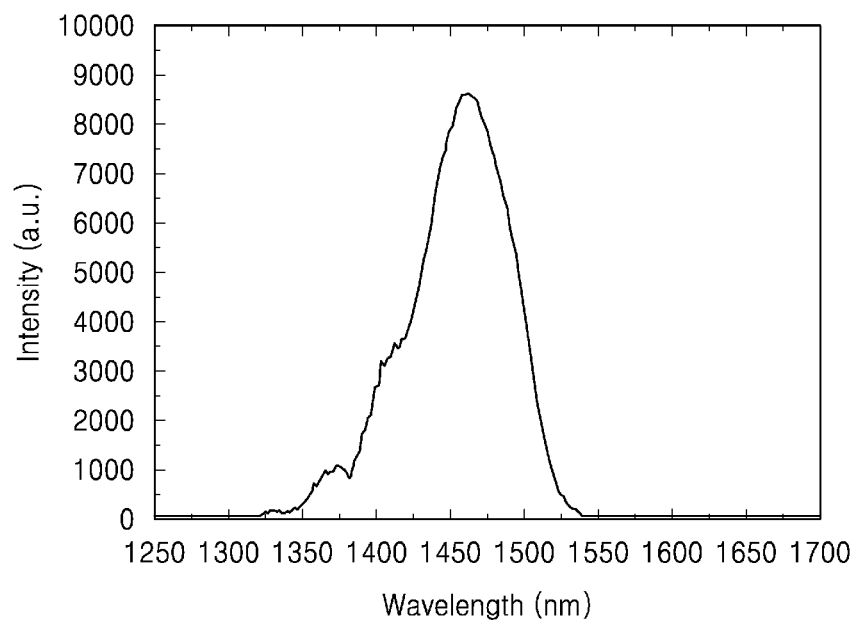
FIG. 5 is a graph illustrating an example photoluminescence (PL) spectrum of the infrared detecting device shown in FIG. 1.

FIG. 5 is a graph illustrating an example photoluminescence (PL) spectrum of the infrared detecting device 100 shown in FIG. 1.

In the infrared detecting device 100 shown in FIG. 1, according to an example embodiment, a Si substrate is used as the substrate 110. A Ge layer is formed on the upper surface of the substrate 110 as the second semiconductor layer 114, and a GaAs layer is formed on the upper surface of the second semiconductor layer 114 as the first semiconductor layer 112. In addition, the superlattice layer 121 of the buffer layer 120 is formed by alternately growing a GaAs layer and an AlAs layer each to a thickness of about 10 nm or less on the upper surface of the first semiconductor layer 112, and the buffer material layer 122 of the buffer layer 120 is formed by depositing a low-temperature InP layer and a high-temperature InP layer on the upper surface of the superlattice layer 121. The at least one light absorbing layer 152 of the light absorbing portion 150 is formed by forming an $In_{0.49}GaAs$ quantum-well layer (e.g., having a thickness of about 7 nm), and the at least one quantum barrier layer 151 of the light absorbing portion 150 is formed by forming an InGaAlAs layer (e.g., having a thickness of about 10 nm).

Referring to FIG. 5, it may be understood that the infrared detecting device 100 absorbs light in an SWIR region having a center wavelength of about 1461 nm.

In the infrared detecting device 100 according to an example embodiment, the buffer layer 120 having a superlattice structure is formed above the substrate 110, and the at least one light absorbing layer 152 having a quantum well structure is formed thereon, such that light may be detected in a specific wavelength band (for example, in an SWIR region) by using a relatively inexpensive substrate such as a Si substrate.

In the related art, infrared detecting devices in which a light absorbing layer is formed by growing an InP layer to a large thickness on an InP substrate are used to detect light in an SWIR region. However, such infrared detecting devices are not suitable for absorbing light only in a specific wavelength band due to the bulk structure of an InGaAs absorbing layer, and thus, require bandpass filters to absorb light only in a specific wavelength band. In addition, infrared detecting devices of the related art may generate noise while sensitively reacting to variations in external temperature, and by including cooling systems required for temperature stabilization for addressing such noise, the volume of the infrared detecting devices may increase. In addition, infrared detecting devices of the related art require expensive InP substrates to detect light in an SWIR region.

In an example embodiment, however, the infrared detecting device 100 is capable of detecting light in an SWIR region while using a Si substrate, which is inexpensive compared to InP substrates, as the substrate 110. In addition, since the at least one light absorbing layer 152 has a quantum well structure, the infrared detecting device 100 may selectively detect light only in an intended specific wavelength band without using a bandpass filter.

Figure 6:
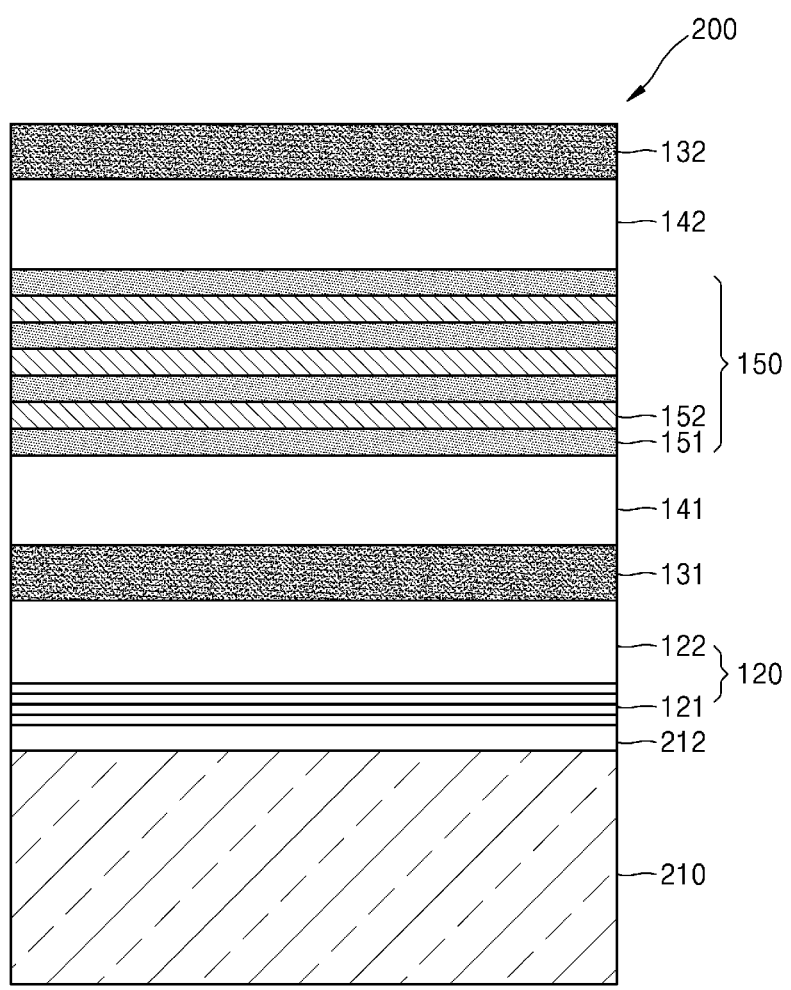
FIG. 6 is a view illustrating an infrared detecting device according to another example embodiment.

FIG. 6 is a view illustrating an infrared detecting device 200 according to another example embodiment. Hereinafter, differences from the above-described embodiment will be mainly described.

Referring to FIG. 6, the infrared detecting device 200 includes a substrate 210, a buffer layer 120, and a light absorbing portion 150. For example, a germanium (Ge) substrate may be used as the substrate 210. However, this is merely an example, and semiconductor substrates including silicon (Si) or other materials may be examples of the substrate 210.

A semiconductor layer 212 may be provided on an upper surface of the substrate 210. Here, the semiconductor layer 212 may include various semiconductor materials according to materials included in the light absorbing portion 150. When the light absorbing portion 150 includes, for example, InGaAs, the semiconductor layer 212 provided on the upper surface of the substrate 210 may include, for example, at least one of GaAs and AlAs.

The buffer layer 120, which has a superlattice structure, is provided on an upper surface of the semiconductor layer 212. The buffer layer 120 may include a superlattice layer 121 and a buffer material layer 122. Here, as described above, the superlattice layer 121 may be provided between the semiconductor layer 212 and the buffer material layer 122 to reduce dislocations, defects, or the like that may occur between the semiconductor layer 212 and the buffer material layer 122.

The superlattice layer 121 may include at least one first material layer and at least one second material layer that are alternately grown on the upper surface of the semiconductor layer 212. Here, the first material layer may include, for example, GaAs, and the second material layer may include, for example, AlAs. In addition, the buffer material layer 122 is provided on an upper surface of the superlattice layer 121. The buffer material layer 122 may include, for example, InP.

A first contact layer 131, a first clad layer 141, the light absorbing portion 150, a second clad layer 142, and a second contact layer 132 may be sequentially stacked on the buffer layer 120. Since the first contact layer 131, the first clad layer 141, the light absorbing portion 150, the second clad layer 142, and the second contact layer 132 are the same as or substantially similar to those described in the example embodiments described above, repeated descriptions thereof are omitted.

Figure 7:
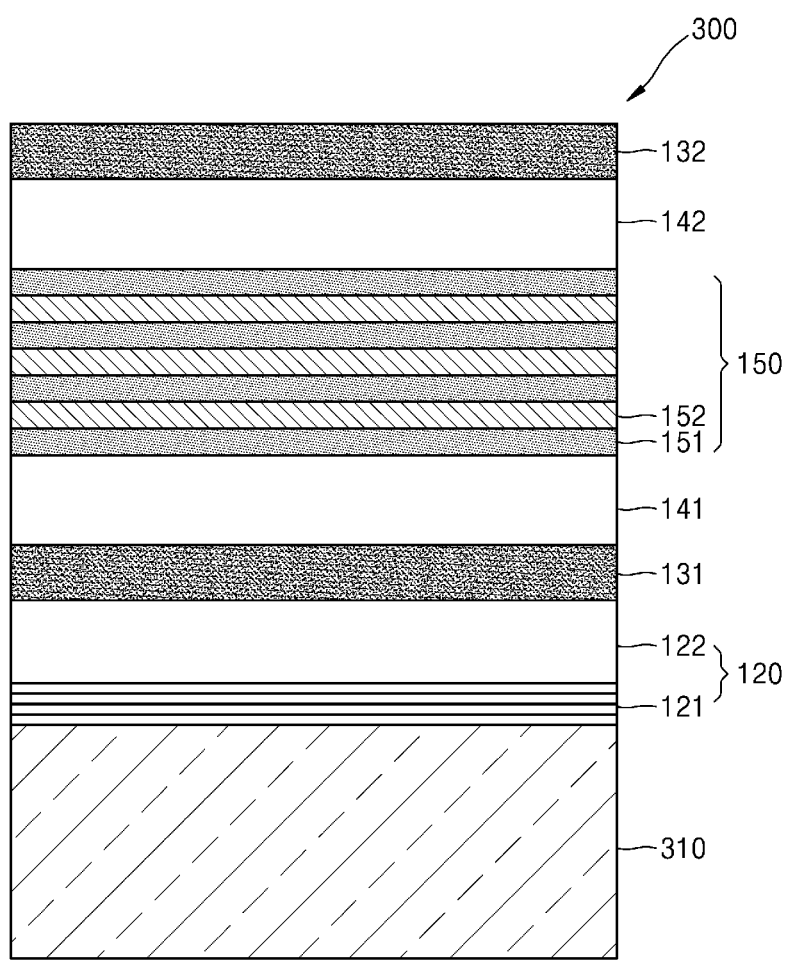
FIG. 7 is a view illustrating an infrared detecting device according to another example embodiment.

FIG. 7 is a view illustrating an infrared detecting device 300 according to another example embodiment.

Referring to FIG. 7, the infrared detecting device 300 includes a substrate 310, a buffer layer 120, and a light absorbing portion 150. For example, a GaAs substrate may be used as the substrate 310. However, this is merely an example, and examples of the substrate 310 include semiconductor substrates including other materials.

The buffer layer 120 is provided on an upper surface of the substrate 310, the buffer layer 120 including a superlattice layer 121 and a buffer material layer 122. The superlattice layer 121 may be provided between the substrate 310 and the buffer material layer 122 to reduce dislocations, defects, or the like that may occur between the substrate 310 and the buffer material layer 122.

The superlattice layer 121 may include at least one first material layer and at least one second material layer that are alternately grown on the upper surface of the substrate 310. Here, the first material layer may include, for example, GaAs, and the second material layer may include, for example, AlAs. In addition, the buffer material layer 122 is provided on an upper surface of the superlattice layer 121. The buffer material layer 122 may include, for example, InP.

A first contact layer 131, a first clad layer 141, the light absorbing portion 150, a second clad layer 142, and a second contact layer 132 may be sequentially stacked on the buffer layer 120. Since the first contact layer 131, the first clad layer 141, the light absorbing portion 150, the second clad layer 142, and the second contact layer 132 are the same as or substantially similar to those described in the example embodiments described above, repeated descriptions thereof are omitted.

Figure 8:
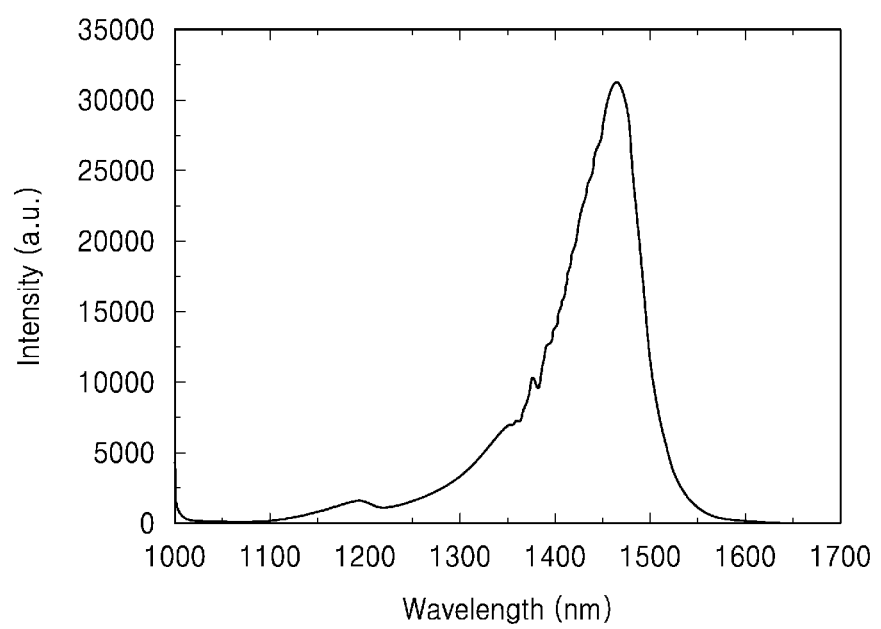
FIG. 8 is a graph illustrating an example PL spectrum of the infrared detecting device shown in FIG. 7.

FIG. 8 is a graph illustrating an example PL spectrum of the infrared detecting device 300 shown in FIG. 7.

In the infrared detecting device 300 shown in FIG. 7, a GaAs substrate is used as the substrate 310. The superlattice layer 121 of the buffer layer 120 is formed by alternately growing GaAs and AlAs layers each to a thickness of about 10 nm or less on the upper surface of the substrate 310, and the buffer material layer 122 of the buffer layer 120 is formed by depositing a low-temperature InP layer and a high-temperature InP layer on the upper surface of the superlattice layer 121. Each light absorbing layer 152 of the light absorbing portion 150 is formed by forming an $In_{0.49}GaAs$ quantum-well layer (e.g., having a thickness of about 7 nm), and each quantum barrier layer 151 of the light absorbing portion 150 is formed by forming an InGaAlP layer (e.g., having a thickness of about 10 nm).

Referring to FIG. 8, it may be understood that the infrared detecting device 300 absorbs light in an SWIR region having a center wavelength of about 1464 nm.

Figure 9:
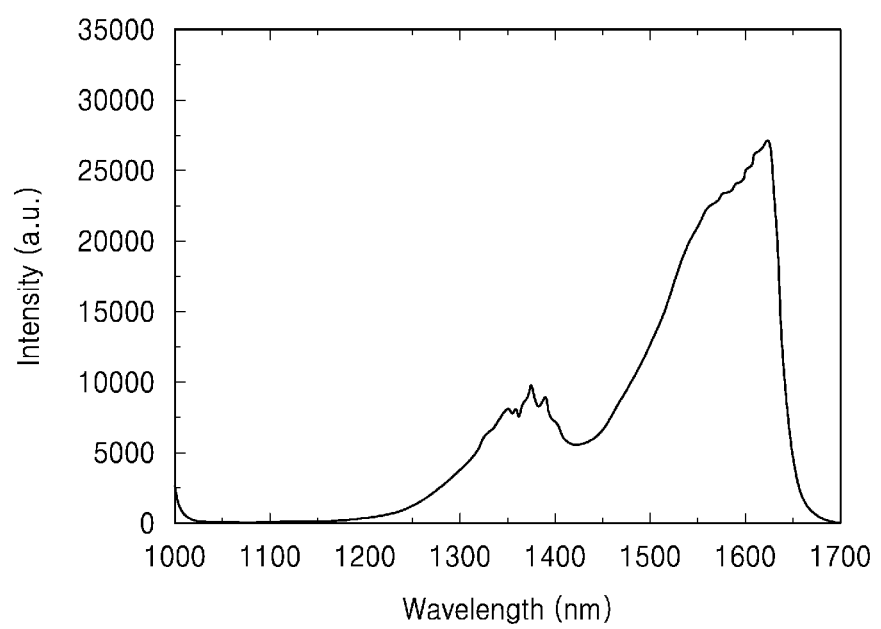
FIG. 9 is a graph illustrating another example PL spectrum of the infrared detecting device shown in FIG. 7.

FIG. 9 is a graph illustrating another example PL spectrum of the infrared detecting device 300 shown in FIG. 7.

In the infrared detecting device 300 shown in FIG. 7, a GaAs substrate is used as the substrate 310. The superlattice layer 121 of the buffer layer 120 is formed by alternately growing GaAs and AlAs layers each to a thickness of about 10 nm or less on the upper surface of the substrate 310, and the buffer material layer 122 of the buffer layer 120 is formed by depositing a low-temperature InP layer and a high-temperature InP layer on the upper surface of the superlattice layer 121. Unlike in FIG. 8, each light absorbing layer 152 of the light absorbing portion 150 is formed by forming an $In_{0.61}GaAs$ quantum-well layer (e.g., having a thickness of about 7 nm). In addition, each quantum barrier layer 151 of the light absorbing portion 150 is formed by forming an InGaAlP layer (e.g., having a thickness of about 10 nm).

Referring to FIG. 9, it may be understood that the infrared detecting device 300 absorbs light in an SWIR region having a center wavelength of about 1622 nm.

Figure 10:
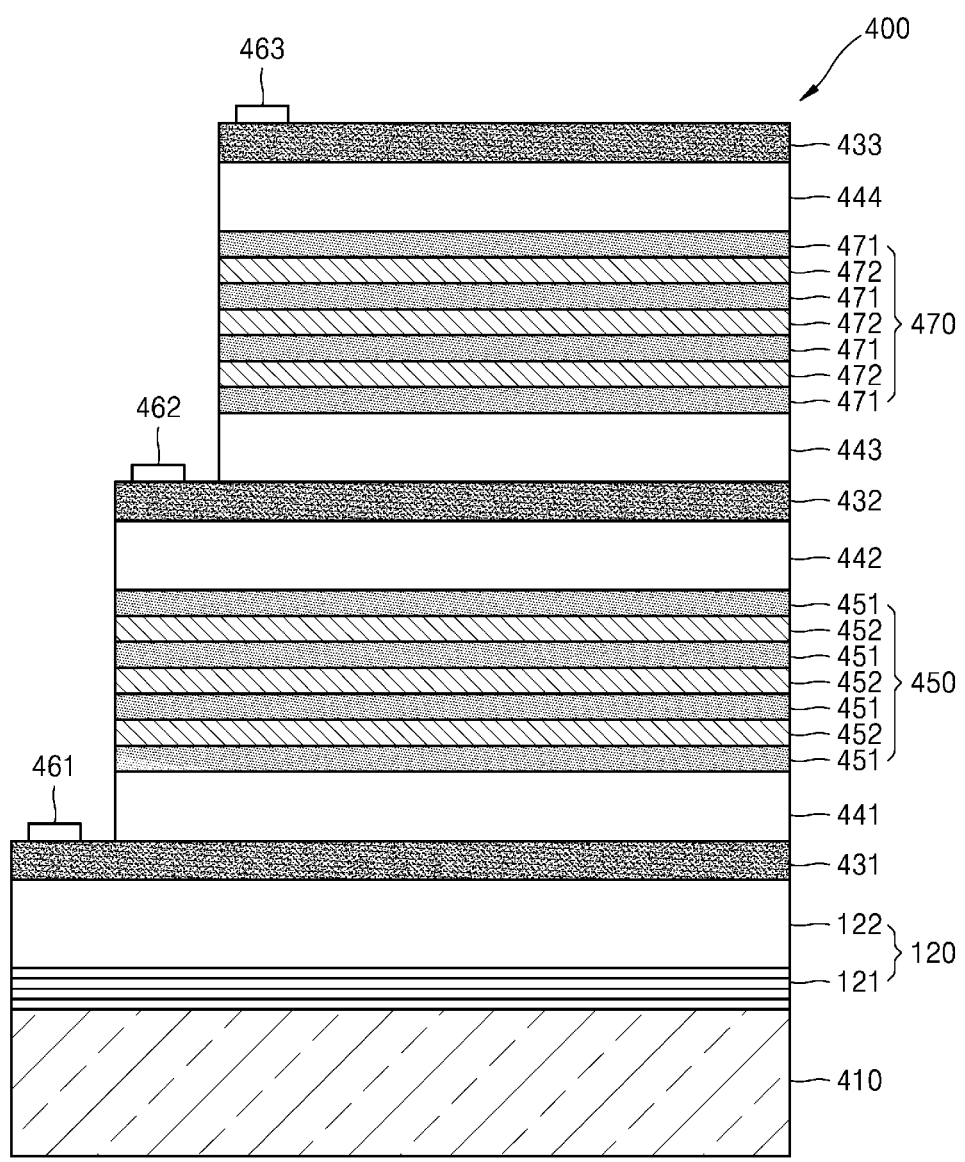
FIG. 10 is a view illustrating an infrared detecting device according to another example embodiment.

FIG. 10 is a view illustrating an infrared detecting device 400 according to another example embodiment.

Referring to FIG. 10, the infrared detecting device 400 includes an infrared detector that absorbs and detects light in a plurality of infrared wavelength bands. The infrared detecting device 400 includes a substrate 410, a buffer layer 120, a first light absorbing portion 450, and a second light absorbing portion 470. For example, a GaAs substrate may be used as the substrate 410. However, this is merely an example.

The buffer layer 120 is provided on an upper surface of the substrate 410, the buffer layer 120 including a superlattice layer 121 and a buffer material layer 122. The superlattice layer 121 may be provided between the substrate 410 and the buffer material layer 122 to reduce dislocations, defects, or the like that may occur between the substrate 410 and the buffer material layer 122.

The superlattice layer 121 may include at least one first material layer and at least one second material layer that are alternately grown on the upper surface of the substrate 410. Here, the first material layer may include, for example, GaAs, and the second material layer may include, for example, AlAs. In addition, the buffer material layer 122 is provided on an upper surface of the superlattice layer 121. The buffer material layer 122 may include, for example, InP.

A first contact layer 431 may be provided on an upper surface of the buffer layer 120. The first contact layer 431 may be, for example, a p-type contact layer. Alternatively, the first contact layer 431 may be an n-type contact layer.

An upper surface of the first contact layer 431 may be partially exposed, and a first electrode 461 may be provided on the exposed upper surface of the first contact layer 431. When the first contact layer 431 is a p-type contact layer, the first electrode 461 may be a p-type electrode. In addition, when the first contact layer 431 is an n-type contact layer, the first electrode 461 may be an n-type electrode.

A first clad layer 441 may be provided on the upper surface of the first contact layer 431. When the first contact layer 431 is a p-type contact layer, the first clad layer 441 may be a p-type clad layer. In addition, when the first contact layer 431 is an n-type contact layer, the first clad layer 441 may be an n-type clad layer.

The first light absorbing portion 450 may be provided on an upper surface of the first clad layer 441. The first light absorbing portion 450 may absorb light in a first wavelength band of an infrared wavelength band. For example, the first light absorbing portion 450 may absorb light in an SWIR region, but is not limited thereto. For example, the first light absorbing portion 450 may absorb light in a wavelength range of about 1200 nm to about 2500 nm.

The first light absorbing portion 450 may include at least one first light absorbing layer 452 and at least one first quantum barrier layer 451 that are alternately stacked. Here, the first light absorbing layer 452 may include at least one of a quantum well, a quantum dot, and a quantum wire.

The first light absorbing layer 452 and the first quantum barrier layer 451 of the first light absorbing portion 450 may include, for example, at least one of indium (In), gallium (Ga), aluminum (Al), arsenic (As), phosphorus (P), silicon (Si), zinc (Zn), and carbon (C). For example, the first light absorbing layer 452 and the first quantum barrier layer 451 may include GaAs, $In_xGaAs$ ($0.05 \le x \le 0.85$), $In_xGaAl_yAs$ ($0.05 \le x \le 0.85$, $0.01 \le y \le 0.75$), $In_xGaAsP_z$ ($0.05 \le x \le 0.85$, $0.05 \le z \le 0.75$), or InP. However, these are merely examples.

A second clad layer 442 may be provided on an upper surface of the first light absorbing portion 450. When the first clad layer 441 is a p-type clad layer, the second clad layer 442 may be an n-type clad layer. In addition, when the first clad layer 441 is an n-type clad layer, the second clad layer 442 may be a p-type clad layer.

A second contact layer 432 may be provided on an upper surface of the second clad layer 442. When the first contact layer 431 is a p-type contact layer, the second contact layer 432 may be an n-type contact layer. In addition, when the first contact layer 431 is an n-type contact layer, the second contact layer 432 may be a p-type contact layer.

An upper surface of the second contact layer 432 may be partially exposed, and a second electrode 462 may be provided on the exposed upper surface of the second contact layer 432. When the second contact layer 432 is an n-type contact layer, the second electrode 462 may be an n-type electrode. In addition, when the second contact layer 432 is a p-type contact layer, the second electrode 462 may be a p-type electrode. In an example embodiment, the second electrode 462 may be a common electrode.

A third clad layer 443 may be provided on an upper surface of the second contact layer 432. When the second clad layer 442 is an n-type clad layer, the third clad layer 443 may be an n-type clad layer. In addition, when the second clad layer 442 is a p-type clad layer, the third clad layer 443 may be a p-type clad layer.

The second light absorbing portion 470 may be provided on a lower surface of the third clad layer 443. The second light absorbing portion 470 may absorb light in a second wavelength band included in the infrared wavelength band but different from the first wavelength band of the infrared wavelength band. For example, the second wavelength band may be a shorter wavelength band than the first wavelength band. The second light absorbing portion 470 may absorb light in an SWIR region. For example, the second light absorbing portion 470 may absorb light in a wavelength range of about 1200 nm to about 2500 nm.

The second light absorbing portion 470 may include at least one second light absorbing layer 472 and at least one second quantum barrier layer 471 that are alternately stacked. Here, the second light absorbing layer 472 may include at least one of a quantum well, a quantum dot, and a quantum wire.

The second light absorbing layer 472 and the second quantum barrier layer 471 of the second light absorbing portion 470 may include, for example, at least one of indium (In), gallium (Ga), aluminum (Al), arsenic (As), phosphorus (P), silicon (Si), zinc (Zn), and carbon (C). For example, the second light absorbing layer 472 and the second quantum barrier layer 471 may include GaAs, $In_xGaAs$ ($0.05 \le x \le 0.85$), $In_xGaAl_yAs$ ($0.05 \le x \le 0.85$, $0.01 \le y \le 0.75$), $In_xGaAsP_z$ ($0.05 \le x \le 0.85$, $0.05 \le z \le 0.75$), or InP. However, these are merely examples.

A fourth clad layer 444 may be provided on an upper surface of the second light absorbing portion 470. When the third clad layer 443 is an n-type clad layer, the fourth clad layer 444 may be a p-type clad layer. In addition, when the third clad layer 443 is a p-type cladding layer, the fourth clad layer 444 may be an n-type cladding layer.

A third contact layer 433 may be provided on an upper surface of the fourth clad layer 444. When the second contact layer 432 is an n-type contact layer, the third contact layer 433 may be a p-type contact layer. In addition, when the second contact layer 432 is a p-type contact layer, the third contact layer 433 may be an n-type contact layer.

A third electrode 463 may be provided on an upper surface of the third contact layer 433. When the third contact layer 433 is an n-type contact layer, the third electrode 463 may be an n-type electrode. In addition, when the third contact layer 433 is a p-type contact layer, the third electrode 463 may be a p-type electrode.

The infrared detecting device 400 having the above-described structure is capable of absorbing and detecting light in different wavelength bands based on the first and the second light absorbing portions 450 and 470 that are vertically stacked on the buffer layer 120. Furthermore, while it is described, as an example, that the infrared detecting device 400 includes two light absorbing portions, for example, the first and the second light absorbing portions 450 and 470, configured to absorb light in different wavelength bands is described above, this is a non-limiting example, and the infrared detecting device 400 may include three or more light absorbing portions configured to absorb light in different wavelength bands.

In an example embodiment, the buffer layer 120 may be directly provided on the upper surface of the substrate 410, as described above. However, this is a non-limiting example. In another example embodiment, a semiconductor layer (not shown) may be provided on the upper surface of the substrate 410, and the buffer layer 120 may be provided on an upper surface of the semiconductor layer. In this case, for example, a Ge substrate or a Si substrate may be used as the substrate 410, and the semiconductor layer may include at least one of GaAs and AlAs. In addition, a second semiconductor layer (not shown) and a first semiconductor layer (not shown) may be sequentially provided on the upper surface of the substrate 410, and the buffer layer 120 may be provided on an upper surface of the first semiconductor layer. In this case, for example, a Si substrate may be used as the substrate 410, the first semiconductor layer may include at least one of GaAs and AlAs, and the second semiconductor layer may include at least one of germanium (Ge), GaP, and AlP. However, these are non-limiting examples.

Figure 11:
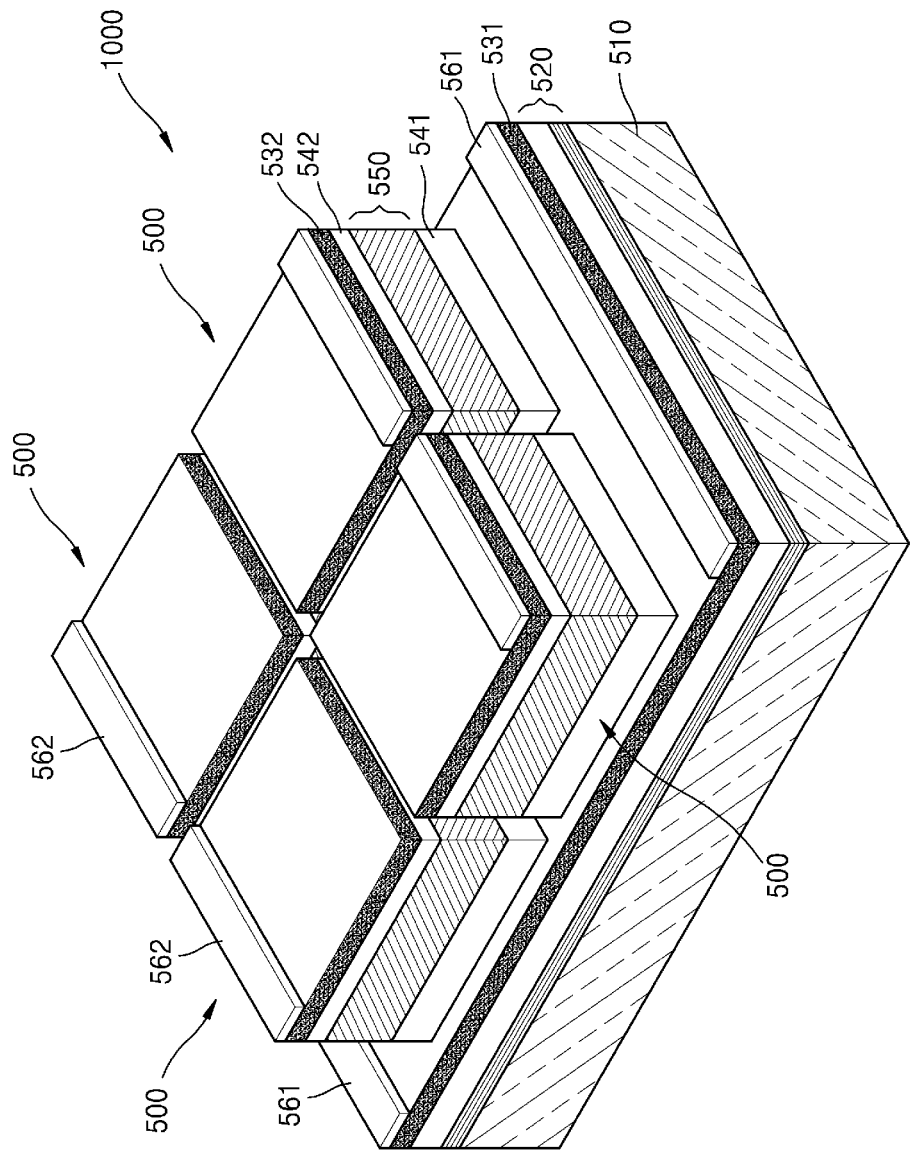
FIG. 11 is a view illustrating an infrared detecting device according to another example embodiment.

FIG. 11 is a view illustrating an infrared detecting device 1000 according to another example embodiment.

Referring to FIG. 11, the infrared detecting device 1000 includes a plurality of infrared detectors 500 arranged as an array on the same plane. FIG. 11 illustrates an example in which the infrared detectors 500 are arranged as a 2×2 two-dimensional array. However, the infrared detectors 500 may be arranged in another two-dimensional array form. In addition, the infrared detectors 500 may be arranged as a one-dimensional array.

Each of the infrared detectors 500 may absorb and detect light in an infrared wavelength band. Each of the infrared detectors 500 may detect light, for example, in a wavelength range of about 1200 nm to about 2500 nm, but is not limited thereto. Here, the infrared detectors 500 may absorb and detect light in different wavelength bands. However, the infrared detectors 500 are not limited thereto, and may detect light in the same wavelength band.

FIG. 11 illustrates an example in which each of the infrared detectors 500 of the infrared detecting device 1000 has the same cross-sectional structure as the infrared detecting device 300 shown in FIG. 7.

Referring to FIG. 11, the infrared detectors 500 may include a substrate 510, a buffer layer 520, and a light absorbing portion 550. The buffer layer 520 including a superlattice layer and a buffer material layer may be provided on an upper surface of the substrate 510, and a first contact layer 531 may be provided on an upper surface of the buffer layer 520. A first electrode 561 may be provided on an exposed upper surface of the first contact layer 531. The substrate 510, the buffer layer 520, the first contact layer 531, and the first electrode 561 may be common elements of the infrared detectors 500, but are not limited thereto.

A first clad layer 541, the light absorbing portion 550, a second clad layer 542, and a second contact layer 532 may be sequentially provided on the upper surface of the first contact layer 531. In addition, a second electrode 562 may be provided on an upper surface of the second contact layer 532.

Each of the infrared detectors 500 of the infrared detecting device 1000 is not limited to the structure shown in FIG. 11, and may have the same structure as that shown in FIG. 2, 6, or 7 described above. In addition, each of the infrared detectors 500 may have a structure including a plurality of detecting portions that are vertically stacked as shown in FIG. 10 to absorb light in different wavelength bands.

Figure 12:
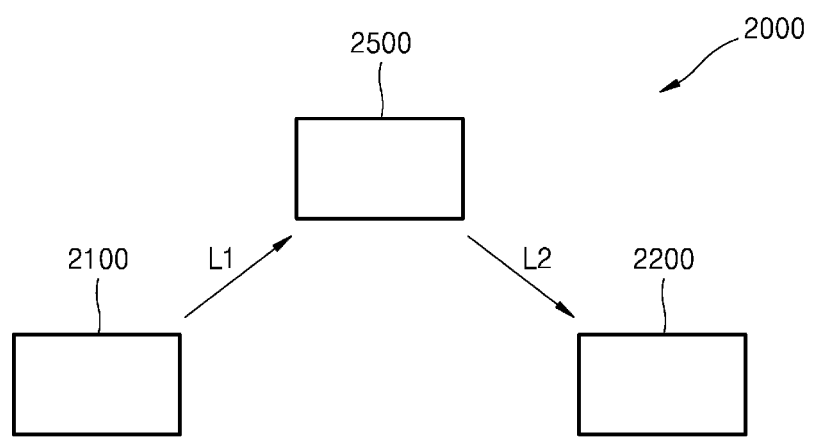
FIG. 12 is a view schematically illustrating an infrared detecting system according to an example embodiment.

FIG. 12 is a view schematically illustrating an infrared detecting system 2000 according to an example embodiment.

Referring to FIG. 12, the infrared detecting system 2000 includes a light source 2100, which emits light L1 onto an object 2500, and an infrared detecting device 2200, which detects light L2 reflected from the object 2500.

For example, a laser diode, a light emitting diode, or a halogen lamp may be used as the light source 2100, but the light source 2100 is not limited thereto. Light L1 is emitted from the light source 2100 onto the object 2500, and the object 2500 may reflect light L2 in an infrared wavelength band.

The infrared detecting device 2200 may absorb and detect the light L2 of the infrared wavelength band, which is reflected from the object 2500. Here, the infrared detecting device 2200 may be one of the infrared detecting devices 100, 200, 300, 400, and 1000 shown in FIGS. 2, 6, 7, 10, and 11.

According to the one or more of the above-described example embodiments, a buffer layer having a superlattice structure is formed on a substrate, and a light absorbing layer having a quantum well structure is formed thereon, such that light having a particular wavelength band (for example, SWIR light) may be detected by using a relatively inexpensive substrate such as a Si substrate, a Ge substrate, or a GaAs substrate. In addition, since the light absorbing layer has a quantum well structure, light may be detected in an intended specific wavelength band without using a bandpass filter.

While example embodiments have been described, the example embodiments are for illustrative purposes only, and it should be understood that those skilled in the art may make various modifications therefrom. Also, a person skilled in the art should understand that elements described in the example embodiments may be optional and thus may be omitted or replaced.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An infrared detecting device, comprising at least one infrared detector,
wherein the at least one infrared detector comprises:
a substrate;
a buffer layer provided on or above the substrate and having a superlattice structure; and
at least one light absorbing portion provided on or above the buffer layer,
wherein the buffer layer comprises:
a superlattice layer comprising at least one first material layer and at least one second material layer that are alternately grown on or above the substrate; and
a buffer material layer grown on the superlattice layer, and
wherein the at least one first material layer comprises GaAs, the at least one second material layer comprises AlAs, and the buffer material layer comprises InP.

2. The infrared detecting device of claim 1, wherein the at least one infrared detector further comprises:
a first contact layer provided between the buffer layer and the at least one light absorbing portion; and
a second contact layer provided on or above the at least one light absorbing portion.

3. The infrared detecting device of claim 1, wherein the buffer material layer comprises:
a low-temperature InP layer grown on an upper surface of the superlattice layer; and
a high-temperature InP layer grown on an upper surface of the low-temperature InP layer.

4. The infrared detecting device of claim 1, wherein the substrate comprises germanium (Ge), and the at least one infrared detector further comprises a semiconductor layer provided on or above the substrate, the semiconductor layer comprising at least one of GaAs and AlAs.

5. The infrared detecting device of claim 1, wherein the at least one light absorbing portion comprises a plurality of light absorbing portions that are stacked on or above the buffer layer and configured to absorb light in different wavelength ranges.

6. The infrared detecting device of claim 1, wherein the at least one infrared detector comprises a plurality of infrared detectors arranged in a one-dimensional array or a two-dimensional array.

7. The infrared detecting device of claim 1, wherein the substrate comprises GaAs.

8. The infrared detecting device of claim 1, wherein the substrate comprises silicon (Si), and the at least one infrared detector further comprises a first semiconductor layer provided on or above the substrate, the first semiconductor layer comprising at least one of GaAs and AlAs.

9. The infrared detecting device of claim 8, wherein the at least one infrared detector further comprises a second semiconductor layer provided between the substrate and the first semiconductor layer.

10. The infrared detecting device of claim 9, wherein the second semiconductor layer comprises at least one of germanium (Ge), GaP, and AlP.

11. The infrared detecting device of claim 1, wherein the at least one light absorbing portion comprises at least one light absorbing layer and at least one quantum barrier layer that are alternately stacked on or above the buffer layer.

12. The infrared detecting device of claim 11, wherein each of the at least one light absorbing layer and the at least one quantum barrier layer comprises at least one of indium (In), gallium (Ga), aluminum (Al), arsenic (As), phosphorus (P), silicon (Si), zinc (Zn), and carbon (C).

13. The infrared detecting device of claim 11, wherein the at least one light absorbing layer comprises at least one of a quantum well, a quantum dot, and a quantum wire.

14. An infrared detecting system comprising:
a light source; and
an infrared detecting device configured to detect infrared light reflected from an object onto which light is emitted from the light source,
wherein the infrared detecting device comprises at least one infrared detector, the at least one infrared detector comprising:
a substrate;
a buffer layer provided on or above the substrate and having a superlattice structure; and
at least one light absorbing portion provided on or above the buffer layer, and
wherein the buffer layer comprises:
a superlattice layer comprising at least one first material layer and at least one second material layer that are alternately grown on or above the substrate; and
a buffer material layer grown on the superlattice layer, and
wherein the at least one first material layer comprises GaAs, the at least one second material layer comprises AlAs, and the buffer material layer comprises InP.

15. The infrared detecting system of claim 14, wherein the at least one light absorbing portion comprises a plurality of light absorbing portions that are stacked on or above the buffer layer and configured to absorb light in different wavelength ranges.

16. The infrared detecting system of claim 14, wherein the at least one light absorbing portion comprises at least one light absorbing layer and at least one quantum barrier layer that are alternately stacked on or above the buffer layer.

17. The infrared detecting system of claim 14, wherein the at least one infrared detector comprises a plurality of infrared detectors arranged in a one-dimensional array or two-dimensional array.

* * * * *